United States Patent
Li

(10) Patent No.: US 9,882,157 B2
(45) Date of Patent: Jan. 30, 2018

(54) OLED LIGHT EMITTING DEVICE AND PRODUCTION METHOD THEREOF AND DISPLAY APPARATUS

(71) Applicant: Boe Technology Group Co., Ltd., Beijing (CN)

(72) Inventor: Yansong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 112 days.

(21) Appl. No.: 14/776,652

(22) PCT Filed: Mar. 9, 2015

(86) PCT No.: PCT/CN2015/073865
§ 371 (c)(1),
(2) Date: Sep. 14, 2015

(87) PCT Pub. No.: WO2016/058317
PCT Pub. Date: Apr. 21, 2016

(65) Prior Publication Data
US 2016/0301026 A1    Oct. 13, 2016

(30) Foreign Application Priority Data
Oct. 15, 2014  (CN) .......................... 2014 1 0545704

(51) Int. Cl.
  *H01L 51/50*   (2006.01)
  *H01L 51/56*   (2006.01)
  *H01L 51/00*   (2006.01)
  *H01L 27/32*   (2006.01)

(52) U.S. Cl.
  CPC .......... *H01L 51/5008* (2013.01); *H01L 51/50* (2013.01); *H01L 51/5068* (2013.01);
  (Continued)

(58) Field of Classification Search
  CPC ............................ H01L 51/5008; H01L 51/56
  See application file for complete search history.

(56) References Cited

U.S. PATENT DOCUMENTS

2004/0214041 A1   10/2004  Lu et al.
2009/0179208 A1   7/2009   Obata et al.
2013/0230942 A1   9/2013   Nalwa et al.

FOREIGN PATENT DOCUMENTS

CN    101667623 A    3/2010
CN    102005539 A    4/2011
(Continued)

OTHER PUBLICATIONS

English translation of CN 102315390 A; Lou, H; Jan. 11, 2012.*
(Continued)

*Primary Examiner* — Thao X Le
*Assistant Examiner* — Xia Cross
(74) *Attorney, Agent, or Firm* — Kinney & Lange, P.A.

(57) ABSTRACT

Disclosed herein is an OLED light emitting device and the production method thereof and a display apparatus. The OLED light emitting device includes a base substrate, and an anode, a cathode, and a light emitting layer located between the anode and the cathode, which are provided on the base substrate, and the OLED light emitting device further comprises a dissociation layer for dissociating excitons which arrive at the dissociation layer into holes and electrons; wherein the dissociation layer is provided between the light emitting layer and the anode in the case where the electron mobility is greater than the hole mobility; and the dissociation layer is provided between the light emitting layer and the cathode in the case where the hole mobility is greater than the electron mobility.

11 Claims, 4 Drawing Sheets

(52) U.S. Cl.
CPC .......... *H01L 51/5084* (2013.01); *H01L 51/56* (2013.01); *H01L 27/3244* (2013.01); *H01L 51/00* (2013.01); *H01L 51/0035* (2013.01); *H01L 51/0036* (2013.01); *H01L 51/0047* (2013.01); *H01L 51/5004* (2013.01); *H01L 51/5056* (2013.01); *H01L 51/5072* (2013.01); *H01L 2251/552* (2013.01)

(56) References Cited

FOREIGN PATENT DOCUMENTS

| | | |
|---|---|---|
| CN | 102315390 A | 1/2012 |
| CN | 102315391 A | 1/2012 |
| CN | 103730579 A | 4/2014 |
| CN | 104051655 A | 9/2014 |
| CN | 104282838 A | 1/2015 |
| CN | 204216094 U | 3/2015 |

OTHER PUBLICATIONS

English translation of CN 103730579 A; Zhang, Z et al.; Apr. 16, 2014.*
English translation of CN 102005539 A; Jiang, Y et al.; Apr. 6, 2011.*
The International Search Report dated Jul. 10, 2015 for International Application No. PCT/CN2015/073865.
First Chinese Office Action, for Chinese Patent Application No. 2014105457047, dated Mar. 17, 2016, 24 pages.

* cited by examiner

OLED LIGHT EMITTING DEVICE AND PRODUCTION METHOD THEREOF AND DISPLAY APPARATUS

TECHNICAL FIELD

This invention relates to the field of display technology, and particularly to an OLED light emitting device and the production method thereof, and a display apparatus comprising the OLED light emitting device.

BACKGROUND ART

An organic light emitting diode (simply referred to as OLED) is an organic thin-film electroluminescent device, which has the advantages of simple production process, low cost, easy formation of flexible structure, wide view angle, etc.; and therefore, the display technology using organic light emitting diodes has become an important display technology.

As shown in FIG. 1, an OLED light emitting device comprises a anode 1, a cathode 2, and a light emitting layer 3 located between the anode 1 and the cathode 2. The principle for light emission is that holes (h) injected from the anode 1 and electrons (e) injected from the cathode 2 are combined at a recombination area of the light emitting layer 3 to form excitons, and the excitons decay to radiate photons so that this OLED light emitting device emits light.

However, investigators find that the mobility of holes in the light emitting layer 3 and the mobility of electrons in the light emitting layer 3 are not the same due to the influence of the material of the light emitting layer 3. On this basis, on the one hand, the difference in mobility will result in different numbers of holes and of electrons injected to the light emitting layer 3, and the injection imbalance of carriers (i.e., electrons and holes) will severely affect the performance and the lifetime of device.

On the other hand, the difference in mobility will result in the formation of excitons by recombination of part of holes and electrons at the interface between the light emitting layer 3 and the cathode 2 or at the interface between the light emitting layer 3 and the anode 1. For example, as shown in FIG. 2, in the case where the mobility of holes is greater than the mobility of electrons, excitons are formed by part of holes and electrons in a recombination area 31 at the interface between the light emitting layer 3 and the cathode 2 due to the relatively fast transport of holes, which are injected from the anode 1, in the light emitting layer 3. As shown in FIG. 3, in the case where the mobility of electrons is greater than the mobility of holes, excitons are formed by part of holes and electrons in a recombination area 31 at the interface between the light emitting layer 3 and the anode 1 due to the relatively fast transport of electrons, which are injected from the cathode 2, in the light emitting layer 3. The severe accumulation of excitons at the interface will cause the quench of organic light emitting diode, further affecting the performance and the lifetime of device.

SUMMARY

Embodiments of present invention provide an OLED light emitting device and the production method thereof and a display apparatus comprising the OLED light emitting device, which ameliorate the problems in the prior art such as carrier injection imbalance and organic light emitting diode quench caused by the accumulation of excitons at the interface.

To achieve the object described above, the embodiments of the present invention employ the following technical solutions:

In one aspect, provided is a an OLED light emitting device, comprising a base substrate, and an anode, a cathode, a light emitting layer located between the anode and the cathode, which are provided on the base substrate, and the OLED light emitting device further comprises a dissociation layer for dissociating excitons which arrive at the dissociation layer into holes and electrons; wherein the dissociation layer is provided between the light emitting layer and the anode in the case where the electron mobility is greater than the hole mobility; and the dissociation layer is provided between the light emitting layer and the cathode in the case where the hole mobility is greater than the electron mobility.

In another aspect, provided is a display apparatus comprising the OLED light emitting device described above.

In still another aspect, provided is a production method of an OLED light emitting device, which comprises forming an anode, a light emitting layer, and a cathode on a base substrate, and the method further comprises forming a dissociation layer for dissociating excitons which arrive at the dissociation layer into holes and electrons; wherein the dissociation layer is formed between the light emitting layer and the anode in the case where the electron mobility is greater than the hole mobility; and the dissociation layer is formed between the light emitting layer and the cathode in the case where the hole mobility is greater than the electron mobility.

Embodiments of the present invention provide an OLED light emitting device and the production method thereof, and a display apparatus comprising the OLED light emitting device. In the embodiments of the present invention, by providing a dissociation layer, excitons which diffuse to the dissociation layer are allowed to be dissociated into holes and electrons. The dissociation layer is provided between the light emitting layer and the anode in the case where the electron mobility is greater than the hole mobility in the light emitting layer; when voltage is applied to the cathode and the anode at the same time, under the effect of the external electric field, holes dissociated in the dissociation layer return to the light emitting layer for participation in light emission, while part of electrons move to the anode, so that the number of electrons injected to the light emitting layer is reduced, thereby ameliorating the problem of injection imbalance of carriers (including holes and electrons). The dissociation layer is provided between the light emitting layer and the cathode in the case where the hole mobility is greater than the electron mobility in the light emitting layer; when voltage is applied to the cathode and the anode at the same time, under the effect of the external electric field, electrons dissociated in the dissociation layer return to the light emitting layer for participation in light emission, while part of holes move to the cathode, so that the number of holes injected to the light emitting layer is reduced, thereby ameliorating the problem of injection imbalance of carriers. Furthermore, since excitons are dissociated into holes and electrons by the dissociation layer, the accumulation of excitons generated at the interface between the light emitting layer and the dissociation layer will not occur, so that the occurrence of organic light emitting diode quench is prevented, thereby ameliorating the performance and the lifetime of device.

DESCRIPTION OF THE FIGURES

In order to illustrate the technical solutions in embodiments of the present invention or in the prior art more clearly, figures required for describing the embodiments or the prior art will be simply introduced below. It is apparent that the figures described below are merely some embodiments of the invention, and other figures may be further obtained by an ordinary skilled person in the art according to these figures without exerting inventive work.

REFERENCE NUMERALS

20-base substrate; 1-anode; 2-cathode; 3-light emitting layer; 31-recombination area; 4-hole transport layer; 5-electron transport layer; 6-hole injection layer; 7-electron injection layer; 10-dissociation layer; 101-donor layer; 101a-donor; 102-acceptor layer; 102a-acceptor.

Description of Embodiments

The technical solutions in the embodiments of the present invention will be described more clearly below in conjunction with accompanying drawings in the embodiments. Obviously, the embodiments described herein are merely part of the embodiments of the invention, rather than all of the embodiments. Based on the embodiments in the disclosure, all other embodiments obtained by those of ordinary skill in the art without performing inventive work belong to the scope protected by the invention.

Figure 1:
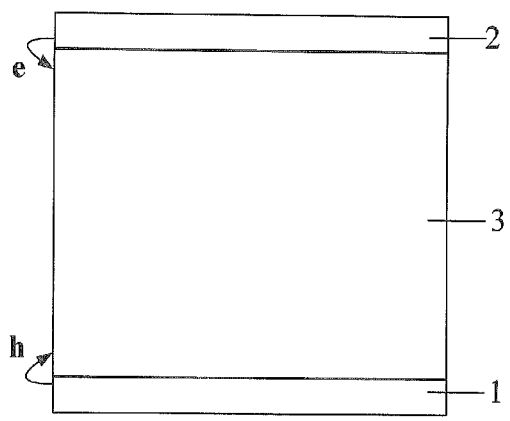
FIG. 1 is a first structural schematic diagram of an OLED light emitting device provided in the prior art.
Figure 2:
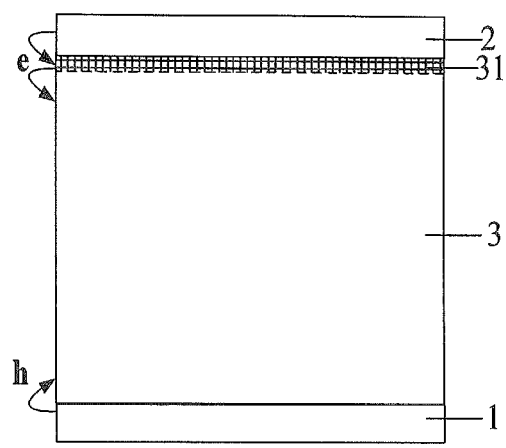
FIG. 2 is a second structural schematic diagram of an OLED light emitting device provided in the prior art.
Figure 3:
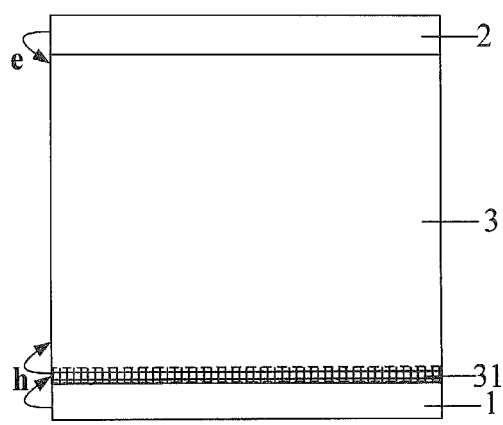
FIG. 3 is a third structural schematic diagram of an OLED light emitting device provided in the prior art.
Figure 4:
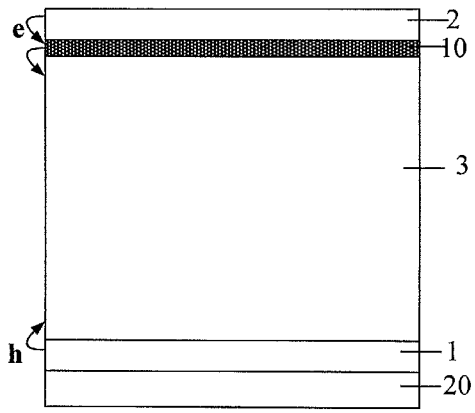
FIG. 4 is a first structural schematic diagram of an OLED light emitting device provided by the invention.
Figure 5:
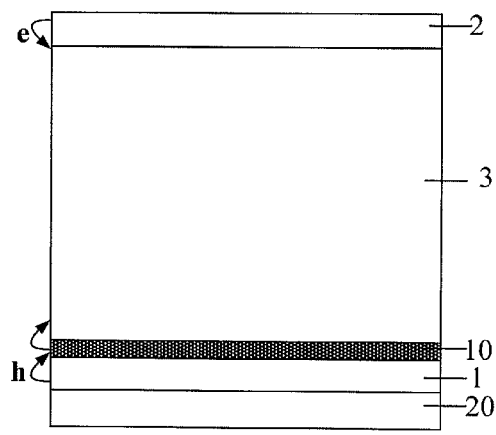
FIG. 5 is a second structural schematic diagram of an OLED light emitting device provided by the invention.
Figure 6:
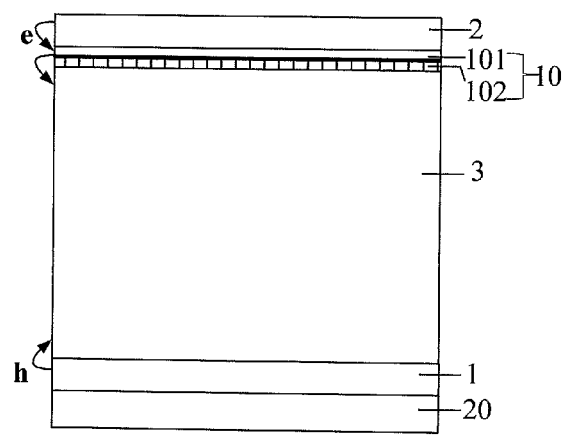
FIG. 6 is a third structural schematic diagram of an OLED light emitting device provided by the invention.

Embodiments of the invention provide an OLED light emitting device. As shown in FIGS. 4-6, the OLED light emitting device comprises a base substrate 20, and an anode 1, a light emitting layer 3, and a cathode 2, which are provided on the base substrate 20, and the OLED light emitting device further comprises a dissociation layer 10 for dissociating excitons which arrive at the dissociation layer 10 into holes (h) and electrons (e).

The dissociation layer 10 is provided between the light emitting layer 3 and the anode 1 in the case where the electron mobility is greater than the hole mobility in the light emitting layer 3; and the dissociation layer 10 is provided between the light emitting layer 3 and the cathode 2 in the case where the hole mobility is greater than the electron mobility in the light emitting layer 3.

It should be noted that, firstly, the material of the light emitting layer may be a hole transport type material in the case where the hole mobility is greater than the electron mobility; and the material of the light emitting layer may be a electron transport type material in the case where the electron mobility is greater than the hole mobility.

The material of the light emitting layer may be specifically determined according to practical situation. For example, as a hole transport type luminescent material, arylamine derivatives may be used, the most common essential structural units thereof are triphenylamine (TPA) and 4,4'-biphenyl diamine (BPDA), for example, hole transport materials commonly used in organic small molecule electroluminescent devices at present, such as 4,4',4''-tris-(3-methylphenylanilino)triphenylamine (m-MTDATA), N,N'-bis-(3-methylphenyl)-1,1'-biphenyl-4,4'-diamine (TPD), N,N'-biphenyl-N,N'-bis-(1-naphthyl-1,1'-biphenyl)-4,4'-diamine (NPD), etc. As an electron transport type luminescent material, metal complexes, for example aluminum 8-hydroxyquinolinate (Alq3) widely used at present, nitrogen-containing five-membered heterocyclics, for example 2-(4-biphenyl)-5-(4-tert-butylphenyl)-1,3,4-oxadiazole (PBD), imidazole compounds, for example 1,3,5-tris(N-phenyl-benzimidizol-2-yl)benzene (TPBI), 2,9-dimethyl-4,7-diphenyl-1,10-phenanthroline (BCP), etc., may be used. However, the present invention is not limited to these materials.

Secondly, embodiments of the invention are not limited to the case of merely comprising the light emitting layer between the anode and the cathode, other organic layers may be further provided between the anode and the light emitting layer or between the cathode and the light emitting layer in order to increase the efficiency of injection and/or transport of electrons and holes, and they are not specifically limited herein.

Thirdly, the material of the dissociation layer is not specifically limited, as long as it is capable of dissociating arrived excitons into holes and electrons.

Embodiments of the invention provide an OLED light emitting device, in which, as shown by FIGS. 4-6, by providing a dissociation layer 10, excitons which diffuse to the dissociation layer 10 are allowed to be dissociated into holes and electrons. On this basis, the dissociation layer 10 is provided between the light emitting layer 3 and the anode 1 in the case where the electron mobility is greater than the hole mobility. On the one hand, under the effect of an external electric field, holes dissociated in the dissociation layer 10 return to the light emitting layer 3 for participation in light emission, while part of electrons move to the anode 1, so that the number of electrons injected to the light emitting layer 3 is reduced, thereby ameliorating the influence on the performance and the lifetime of device caused by injection imbalance of carriers. On the other hand, since excitons are dissociated into holes and electrons by the dissociation layer 10, the accumulation of excitons generated at the interface will not occur, so that the phenomenon of quench will not occur, thereby improving the performance and the lifetime of device.

Similarly, the dissociation layer 10 is provided between the light emitting layer 3 and the cathode 2 in the case where the hole mobility is greater than the electron mobility. On the one hand, under the effect of an external electric field, electrons dissociated in the dissociation layer 10 return to the light emitting layer 3 for participation in light emission, while part of holes move to the cathode 2, so that the number of holes injected to the light emitting layer 3 is reduced, thereby ameliorating the influence on the performance and the lifetime of devices caused by injection imbalance of carriers. On the other hand, since excitons are dissociated into holes and electrons by the dissociation layer 10, the accumulation of excitons generated at the interface will not occur, so that the phenomenon of quench will not occur, thereby improving the performance and the lifetime of device.

Figure 8:
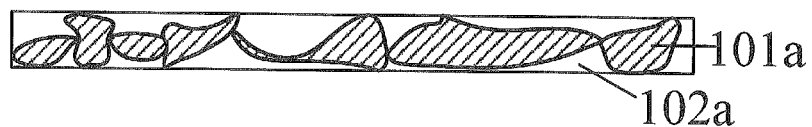
FIG. 8 is structural schematic diagram of the dissociation layer in FIG. 4.

Preferably, as shown in FIGS. 4, 5 and 8, the dissociation layer 10 may comprise at least one layer, and each layer is formed by mixing a donor material and an acceptor material, wherein the LUMO (lowest unoccupied molecular orbital) value of the donor material is greater than that of the acceptor material. In this way, electrons may migrate from the donor material having a higher LUMO value to the acceptor material having a lower LUMO value. All of the embodiments and the figures of the invention are illustrated in details by exemplifying the dissociation layer as one layer, which is formed by mixing a donor material and an acceptor material, but of course, the dissociation layer may also comprise a plurality of layers.

Figure 7:
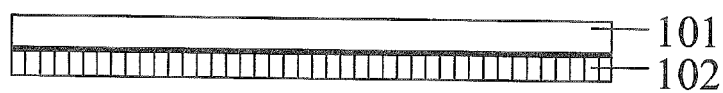
FIG. 7 is structural schematic diagram of the dissociation layer in FIG. 6.

Or, as shown in FIGS. 6 and 7, the dissociation layer 10 may comprise at least two layers, and each layer is formed from a donor material or an acceptor material and two adjacent layers are formed from different materials, wherein the LUMO value of the donor material is greater than that of the acceptor material. In this way, electrons may migrate from the donor material having a higher LUMO value to the acceptor material having a lower LUMO value.

Here, the expression that each layer is formed from a donor material or an acceptor material and two adjacent layers are formed from different materials means that if the material of a first layer of the dissociation layer is a donor material, the material of a second layer adjacent to the first layer is an acceptor material, and so on. A dissociation layer 10 comprising two layers is exemplified in FIGS. 6 and 7, wherein one layer is a donor layer 101 formed from a donor material, and the other layer is an acceptor layer 102 formed from an acceptor material. Of course, dissociation layer may further comprise three layers, four layers, and so on, and when the dissociation layer comprises a plurality of layers, two adjacent layers are a donor layer formed from a donor material and an acceptor layer formed from an acceptor material respectively. The embodiments and the figures of the invention are illustrated in details merely by exemplifying the dissociation layer comprising two layers.

The principle for the dissociation of excitons into holes and electrons by the dissociation layer is specifically illustrated below. The dissociation layer comprises a donor material and an acceptor material, and a donor is formed from the donor material and an acceptor is formed from the acceptor material, so that the donor and the acceptor have different electron affinities and ionization potentials. When two kinds of materials having different electron affinities and ionization potentials are in contact with each other, electrical potential difference, which may form a local electric field, will generate at the contact interface. Since the LUMO value of the donor is higher than that of the acceptor, electrons in excitons diffused from the light emitting layer to the dissociation layer descend from the conduction band of the donor to the conduction band of the acceptor under the effect of this local electric field, and electron-hole pairs in original excitons are destroyed, so that excitons are dissociated into holes and electrons.

On this basis, when the dissociation layer comprises at least two layers and each layer is formed from a donor material or an acceptor material and two adjacent layers are formed from different materials, a junction of the donor and the acceptor (i.e., the interface of the donor and the acceptor) may be formed between the donor layer and the acceptor layer, so that excitons diffused from the light emitting layer to the dissociation layer are dissociated into electrons and holes when passing through this junction.

For example, as shown in FIGS. 6 and 7, the dissociation layer 10 comprises a donor layer 101 and an acceptor layer 102, wherein the donor layer 101 is formed from a donor material and the acceptor layer 102 is formed from an acceptor material, and the junction of the donor and the acceptor is formed at the contact interface between these two layers. When excitons diffused from the light emitting layer 3 to the dissociation layer 10 pass through the acceptor layer 102 and thereafter arrive at and pass through this junction, the excitons are dissociated into electrons and holes.

In this case, based on the position of the dissociation layer 10 in FIG. 6, dissociated electrons pass through the acceptor layer 102 and return to the light emitting layer 3 for participation in light emission, while part of dissociated electrons pass through the donor layer 101 and move to the anode 2.

When the dissociation layer comprises at least one layer and each layer is formed by mixing a donor material and an acceptor material, wherein a donor is formed from the donor material, an acceptor is formed from the acceptor material, and donors and acceptors are dispersively arranged in the dissociation layer, the area of the junction of the donor and the acceptor (i.e., the interface of the donor and the acceptor) is large, so that the efficiency of dissociation into electrons and holes is higher when excitons diffused from the light emitting layer to the dissociation layer pass through the junction of the donor and the acceptor.

Furthermore, as compared to the case where the dissociation layer comprises at least two layers, when the dissociation layer comprises the at least one layer, excitons are not required to traverse a donor layer or an acceptor layer so as to arrive at the junction of the donor and the acceptor, and thus the rate of dissociation of excitons is promoted.

For example, with reference to FIG. 4, the dissociation layer 10 comprises one layer, when excitons diffused from the light emitting layer 3 to the dissociation layer 10 pass through the junction of the donor 101a and the acceptor 102a as shown in FIG. 8, excitons are dissociated into electrons and holes.

In this case, based on the position of the dissociation layer 10 in FIG. 4, dissociated electrons pass through the acceptor 102a and return to the light emitting layer 3 for participation in light emission, while part of dissociated holes pass through the donor 101a and move to the anode 2.

It should be noted that the number of layers and the total thickness of the dissociation layer may be determined according to the diffusion distance of excitons, based on the maximal dissociation of excitons, and are not specifically limited in the embodiments of the invention.

It is further preferable that the donor material may be a p-type organic hole transport material, which may include P3HT (poly(3-hexylthiophene)), MEHPPV (poly[2-methoxy-5-(2-ethylhexyloxy)]-p-phenylenevinylene), PCDTBT (poly[[9-(1-octylnonyl)-9H-carbazole-2,7-diyl]-2,5-thiophenediyl-2,1,3-benzothiadiazole-4,7-diyl-2,5-thiophenediyl]), PTB7 (polybenzodithiophene), PCPDTBT (poly[2,1,3-benzothiadiazole-4,7-diyl [4,4-bis(2-ethylhexyl)-4H-cyclopenta[2,1-b:3,4-b']dithiophene-2,6-diyl]]), PBDTTT-CF (2-(4-biphenyl)-5-phenyloxadiazole derivative), etc.

The acceptor material may be a n-type organic electron transport material, which may include PCBM ([6,6]-phenyl-C61-butyric acid methyl esters methyl ester), PC71BM ([6,6]-phenyl-C71-butyric acid methyl ester), etc.

Exemplarily, the material of the dissociation layer may comprise one donor material and one acceptor material. For example, the dissociation layer comprises P3HT and PCBM, or comprises MEHPPV and PCBM, or comprises PCDTBT and PC71BM, or comprises PTB7 and PC71BM, or comprises PDTSTPD and PC71BM, or comprises PBDTTT-CF and PC71BM. The material of the dissociation layer may also comprise a combination of one or more donor materials and one or more acceptor materials.

On the basis described above, since there are great energy level differences of the anode and the cathode from the light emitting layer, in order to improve the efficiency of injection and transport of holes and/or electrons, a preferable OLED light emitting device in the embodiments of the invention further comprises a first organic layer provided between the light emitting layer and the anode and/or a second organic layer provided between the light emitting layer and the cathode.

The dissociation layer is provided between the light emitting layer and the first organic layer in the case where the electron mobility is greater than the hole mobility; and the dissociation layer is provided between the light emitting layer and the second organic layer in the case where the hole mobility is greater than the electron mobility.

In this way, using different energy level structures of materials, the efficiency of injection and transport of holes and/or electrons may be effectively improved by adjusting the energy level difference between the first organic layer and the anode and/or the energy level difference between the second organic layer and the cathode.

The OLED light emitting device described above may comprises a first organic layer provided between the light emitting layer and the anode and/or a second organic layer provided between the light emitting layer and the cathode, that is, the OLED light emitting device may only comprise a first organic layer provided between the light emitting layer and the anode, or only comprise a second organic layer provided between the light emitting layer and the cathode, or the OLED light emitting device may comprise a first organic layer provided between the light emitting layer and the anode and a second organic layer provided between the light emitting layer and the cathode.

Further, the first organic layer comprises at least one of a hole transport layer and a hole injection layer, and the second organic layer comprises at least one of an electron transport layer and an electron injection layer. That is, the first organic layer may only comprise one of a hole transport layer and a hole injection layer, and may also comprise both a hole transport layer and a hole injection layer. The second organic layer may only comprise one of an electron transport layer and an electron injection layer, and may also comprise both an electron transport layer and an electron injection layer.

Figure 9:
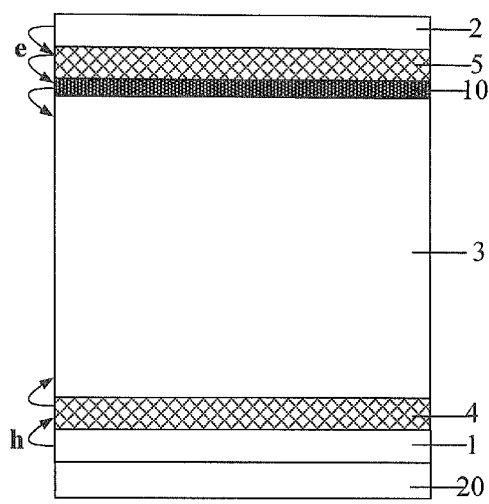
FIG. 9 is a fourth structural schematic diagram of an OLED light emitting device provided by the invention.
Figure 10:
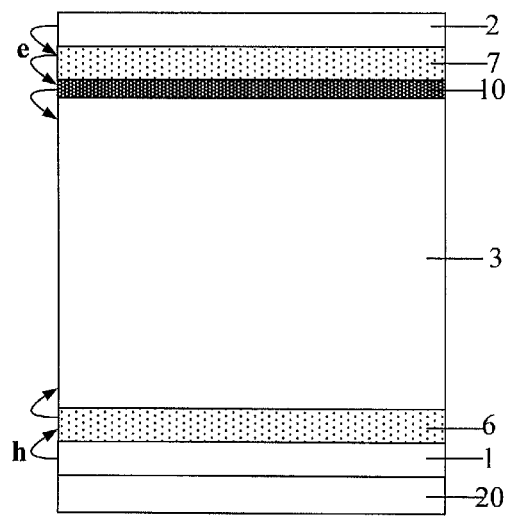
FIG. 10 is a fifth structural schematic diagram of an OLED light emitting device provided by the invention.
Figure 11:
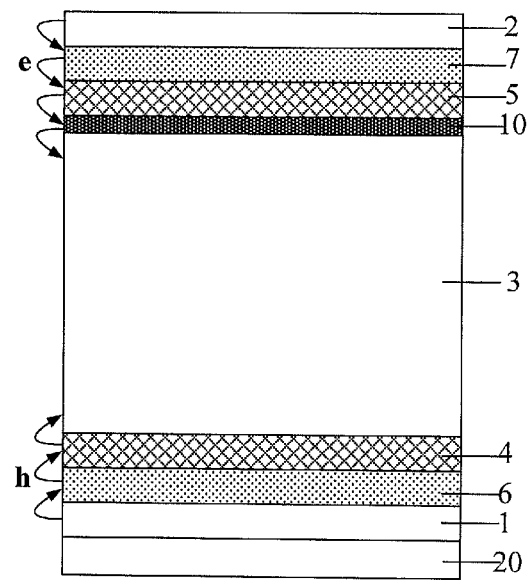
FIG. 11 is a sixth structural schematic diagram of an OLED light emitting device provided by the invention.

Hereafter, with reference to FIGS. 9-11, the arrangements of the first organic layer and the second organic layer are specifically illustrated by exemplifying several cases, where the OLED light emitting device comprises a first organic layer and a second organic layer and the dissociation layer is provided between the light emitting layer and the second organic layer, in the case where the hole mobility is greater than the electron mobility.

As shown in FIG. 9, the second organic layer comprises an electron transport layer 5, the first organic layer comprises a hole transport layer 4, and the dissociation layer 10 is provided between the light emitting layer 3 and the electron transport layer 5. Or, as shown in FIG. 10, the second organic layer comprises an electron injection layer 7, the first organic layer comprises a hole injection layer 6, and the dissociation layer 10 is provided between the light emitting layer 3 and the electron injection layer 7. Or, as shown in FIG. 11, the second organic layer comprises an electron transport layer 5 and an electron injection layer 7, wherein the electron injection layer 7 is adjacent to the cathode 2, the first organic layer comprises a hole transport layer 4 and a hole injection layer 6, and the dissociation layer 10 is provided between the light emitting layer 3 and the electron transport layer 5.

It should be noted that FIGS. 9-11 merely exemplify part of combinations for the OLED light emitting device comprising a first organic layer and a second organic layer in the case where the hole mobility is greater than the electron mobility. With the proviso that the performance of the OLED light emitting device is satisfied, any combination made according to the manners provided by the embodiments of the invention is within the protection scope of the invention.

In the case where the electron mobility is greater than the hole mobility, the dissociation layer is provided between the light emitting layer and the first organic layer. The arrangement of the first organic layer and the second organic layer may be referred to the above case where the hole mobility is greater than the electron mobility, and is not repeatedly described herein.

In order to improve the efficiency of injection and transport of holes and electrons and to elongate the lifetime of device, in the embodiments of the invention, it is preferable that the first organic layer comprises a hole transport layer 4 and a hole injection layer 6 and the second organic layer comprises an electron transport layer 5 and an electron injection layer 7, as shown in FIG. 11.

An embodiment of the invention provides a display apparatus, which comprises the OLED light emitting device described above. The display apparatus may be a display device, such as an OLED display, and may be any product or member with display function comprising this display device, such as a television, a digital camera, a cell phone, a tablet computer, etc.

Further, in view of the deficient aspect of a passive matrix when being used in a large-size display apparatus, it is preferable that the display apparatus provided in an embodiment of the invention is an active matrix type OLED display apparatus. That is, the display apparatus further comprises an electrically connected thin-film transistor between the base substrate and the anode or the cathode of the OLED light emitting device.

The thin-film transistor comprises a gate electrode, a gate insulating layer, a semiconductor active layer, a source electrode, and a drain electrode; and the thin-film transistor may be top gate type or may be bottom gate type.

Of course, the display apparatus further comprises a gate line, a gate line lead wire, etc., which are electrically connected to the gate electrode, and a data line, a data line lead wire, etc.; which are electrically connected to the source electrode. Only thin films or layer structures related to the inventive point of the invention are exemplified by the embodiments of the invention.

An embodiment of the invention provides a production method of an OLED light emitting device, which comprises forming an anode, a light emitting layer, and a cathode on a base substrate, and the method further comprises forming a dissociation layer for dissociating excitons which arrive at the dissociation layer into holes and electrons, wherein the dissociation layer is formed between the light emitting layer and the anode in the case where the electron mobility is greater than the hole mobility; and the dissociation layer is formed between the light emitting layer and the cathode in the case where the hole mobility is greater than the electron mobility.

Based on the above description, when the dissociation layer is formed between the light emitting layer and the cathode, the production method of this OLED light emitting device may specifically include the following steps:

S01, forming an anode on a base substrate.

Wherein, the material of the anode may be ITO (indium tin oxide).

S02, sequentially forming a light emitting layer and a dissociation layer on the anode, after the base substrate having the anode formed thereon is subject to cleaning and plasma pretreatment.

Particularly, the method for forming the light emitting layer may comprise placing the pretreated base substrate having the anode formed thereon in a vapor deposition apparatus and by means of vapor deposition, applying a light emitting layer material to the anode by means of physical vapor deposition. Of course, a full-wet process, for example spin coating, inkjet printing, etc., may be employed to form a light emitting layer on the anode.

As for the dissociation layer, it may comprise at least one layer and each layer is formed by mixing a donor material and an acceptor material, as shown in FIG. 4; or it may comprise at least two layers and each layer is formed from a donor material or an acceptor material and two adjacent layers are formed from different materials, as shown in FIG. 6; wherein, the LUMO value of the donor material is greater than that of the acceptor material.

On this basis, in the case where the dissociation layer 10 comprises at least one layer and each layer is formed by mixing a donor material and an acceptor material as shown in FIG. 4, the method for forming the dissociation layer may comprise applying a dissociation layer 10 on the light emitting layer 3 by means of co-doping. Of course, a full-wet process, for example spin coating, inkjet printing, etc., may be employed to form a dissociation layer 10 on the light emitting layer 3.

In the case where the dissociation layer 10 comprises at least two layers and each layer is formed from a donor material or an acceptor material and two adjacent layers are formed from different materials as shown in FIG. 6, the method for forming the dissociation layer may comprise sequentially forming an acceptor layer 102 and a donor layer 101, which constitute a dissociation layer 10, on the light emitting layer 3 using a full-wet process, for example spin coating, inkjet printing, etc.; wherein the material of the acceptor layer 102 is an acceptor material, and the material of the donor layer 101 is a donor material.

Here, preferably, the donor material may be a p-type organic hole transport material, which may include P3HT, MEHPPV, PCDTBT, PTB7, PCPDTBT, PBDTTT-CF, etc.; and the acceptor material may be a n-type organic electron transport material, which may include PCBM, PC71BM, etc.

Exemplarily, the material of the dissociation layer may comprise one donor material and one acceptor material. For example, the dissociation layer comprises P3HT and PCBM, or comprises MEHPPV and PCBM, or comprises PCDTBT and PC71BM, or comprises PTB7 and PC71BM, or comprises PDTSTPD and PC71BM, or comprises PBDTTT-CF and PC71BM.

S03, forming a cathode on the dissociation layer by vapor deposition.

Wherein, the material of the cathode may be a metal material, for example Al, Au, Ag, an alloy of Mg—Ag, etc.

The OLED light emitting device as shown in FIGS. 4-6 may be formed via the steps S01-S03 described above. It should be noted that the order of forming each layer structure may be different according to particular display apparatuses in the embodiments of the invention. For example, since the light emitting layer and the dissociation layer are located between the cathode and the anode, it is possible that the cathode is first formed, then the light emitting layer and the dissociation layer are formed, and finally the anode is formed; or it is also possible that the anode is first formed, then the light emitting layer and the dissociation layer are formed, and finally the cathode is formed. The embodiments of the invention are illustrated in details merely by exemplifying the steps S01-S03 described above.

In the case where the dissociation layer is formed between the light emitting layer and the anode, the production method of the OLED light emitting device may specifically include a step of sequentially forming an anode, a dissociation layer, a light emitting layer, and a cathode on a base substrate. Except for the order of formation, this method is the same as the production method described above, and is not repeatedly described herein.

Based on the above, preferably, since there are great energy level differences of the anode and the cathode from the light emitting layer, in order to improve the efficiency of injection and transport of holes and electrons, it is possible to form a first organic layer between the light emitting layer and the anode and to form a second organic layer between the light emitting layer and the cathode, wherein the dissociation layer is formed between the light emitting layer and the first organic layer in the case where the electron mobility is greater than the hole mobility; and the dissociation layer is formed between the light emitting layer and the second organic layer in the case where the hole mobility is greater than the electron mobility.

The production methods of the first organic layer and the second organic layer are the same as the production method of the light emitting layer described above, and are not repeatedly described herein.

Further, the first organic layer comprises at least one of a hole transport layer and a hole injection layer, and the second organic layer comprises at least one of an electron transport layer and an electron injection layer.

Exemplarily, as shown in FIG. 9, the first organic layer may only comprise the hole transport layer 4; as shown in FIG. 10, the first organic layer may only comprise the hole injection layer 6; or as shown in FIG. 11, the first organic layer may comprise both the hole transport layer 4 and the hole injection layer 6.

Similarly, as shown in FIG. 9, the second organic layer may only comprise the electron transport layer 5; as shown in FIG. 10, the second organic layer may only comprise the electron injection layer 7; or as shown in FIG. 11, the first organic layer may comprise both the electron transport layer 5 and the electron injection layer 7.

The above embodiments are only specific embodiments of the invention, but the scope of the invention is not limited thereto. Within the technical scope disclosed by this present invention, any person skilled in the art will easily conceive variations or replacements, which should be covered by the scope of the invention. Therefore, the protection scope of the invention should be determined by the scope of the claims.

The present application claims the priority of Chinese Patent Application No. 201410545704.7, filed on Oct. 15, 2014, which is incorporated herein by reference in its entirety.

What is claimed is:

1. An organic light emitting diode (OLED) light emitting device, comprising a base substrate, and an anode, a cathode, a light emitting layer located between the anode and the cathode, which are provided on the base substrate, wherein the OLED light emitting device further comprises a dissociation layer for dissociating excitons which arrive at the dissociation layer into holes and electrons;
  wherein the dissociation layer is provided between the light emitting layer and the anode in the case where the electron mobility is greater than the hole mobility in the light emitting layer;
  wherein the dissociation layer is provided between the light emitting layer and the cathode in the case where the hole mobility is greater than the electron mobility in the light emitting layer,
  wherein the dissociation layer comprises at least one layer, and each of the at least one layer is formed by mixing a donor material and an acceptor material; or the dissociation layer comprises at least two layers, and each of the at least two layers is formed from a donor material or an acceptor material and two adjacent layers are formed from different materials;
  wherein the lowest unoccupied molecular orbital (LUMO) value of the donor material is greater than that of the acceptor material; and
  wherein the donor material consists of a p-type organic hole transport material that is P3HT, MEHPPV, PCDTBT, PTB7, PCPDTBT, or PBDTTT-CF, and the acceptor material consists of a n-type organic electron transport material that is PCBM or $PC_{71}BM$.

2. The OLED light emitting device according to claim 1, wherein the material of the light emitting layer in which the electron mobility is greater than the hole mobility comprises an electron transport type luminescent material.

3. The OLED light emitting device according to claim 1, wherein the material of the light emitting layer in which the hole mobility is greater than the electron mobility comprises a hole transport type luminescent material.

4. The OLED light emitting device according to claim 1, wherein the OLED light emitting device further comprises a first organic layer provided between the light emitting layer and the anode and/or a second organic layer provided between the light emitting layer and the cathode;
  wherein the dissociation layer is provided between the light emitting layer and the first organic layer in the case where the electron mobility is greater than the hole mobility; and
  the dissociation layer is provided between the light emitting layer and the second organic layer in the case where the hole mobility is greater than the electron mobility.

5. The OLED light emitting device according to claim 4, wherein the first organic layer comprises at least one of a hole transport layer and a hole injection layer, and the second organic layer comprises at least one of an electron transport layer and an electron injection layer.

6. A display apparatus, characterized by including the OLED light emitting device according to claim 1.

7. The display apparatus according to claim 6, wherein the material of the light emitting layer in which the electron mobility is greater than the hole mobility comprises an electron transport type luminescent material.

8. The display apparatus according to claim 6, wherein the material of the light emitting layer in which the hole mobility is greater than the electron mobility comprises a hole transport type luminescent material.

9. The display apparatus according to claim 6, wherein the OLED light emitting device further comprises a first organic layer provided between the light emitting layer and the anode and/or a second organic layer provided between the light emitting layer and the cathode;
  wherein the dissociation layer is provided between the light emitting layer and the first organic layer in the case where the electron mobility is greater than the hole mobility; and
  the dissociation layer is provided between the light emitting layer and the second organic layer in the case where the hole mobility is greater than the electron mobility.

10. A production method of an OLED light emitting device, which comprises forming an anode, a light emitting layer, and a cathode on a base substrate, wherein the method further comprises forming a dissociation layer for dissociating excitons which arrive at the dissociation layer into holes and electrons;
  wherein the dissociation layer is formed between the light emitting layer and the anode in the case where the electron mobility is greater than the hole mobility; and
  the dissociation layer is formed between the light emitting layer and the cathode in the case where the hole mobility is greater than the electron mobility,
  wherein forming the dissociation layer comprises:
    forming at least one layer, wherein each of the at least one layer is formed by mixing donor material and an acceptor material; or forming at least two layers, wherein each of the at least two layers is formed from a donor material or an acceptor material and two adjacent layers are formed from different materials;
    wherein the LUMO value of the donor material is greater than that of the acceptor material; and
    wherein the donor material consists of a p-type organic hole transport material that is P3HT, MEHPPV, PCDTBT, PTB7, PCPDTBT, or PBDTTT-CF, and the acceptor material consists of a n-type organic electron transport material that is PCBM or $PC_{71}BM$.

11. The method according to claim 10, wherein the method further comprises forming a first organic layer between the light emitting layer and the anode and/or forming a second organic layer between the light emitting layer and the cathode;
  wherein the dissociation layer is formed between the light emitting layer and the first organic layer in the case where the electron mobility is greater than the hole mobility; and
  the dissociation layer is formed between the light emitting layer and the second organic layer in the case where the hole mobility is greater than the electron mobility.

* * * * *